United States Patent [10] Patent No.: US 10,439,584 B2
Oomori et al. (45) Date of Patent: Oct. 8, 2019

(54) COMMON MODE NOISE FILTER

(71) Applicant: Panasonic Intellectual Property Management Co., Ltd., Osaka (JP)

(72) Inventors: Yoshiharu Oomori, Osaka (JP); Atsushi Shinkai, Fukui (JP); Masakatsu Nawate, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/062,043

(22) PCT Filed: Jun. 15, 2017

(86) PCT No.: PCT/JP2017/022045
§ 371 (c)(1),
(2) Date: Jun. 13, 2018

(87) PCT Pub. No.: WO2017/221794
PCT Pub. Date: Dec. 28, 2017

(65) Prior Publication Data
US 2018/0367115 A1 Dec. 20, 2018

(30) Foreign Application Priority Data
Jun. 22, 2016 (JP) ................................. 2016-123190

(51) Int. Cl.
H03H 7/09 (2006.01)
H03H 7/42 (2006.01)
(Continued)

(52) U.S. Cl.
CPC ......... H03H 7/427 (2013.01); H01F 17/0013 (2013.01); H01F 17/04 (2013.01);
(Continued)

(58) Field of Classification Search
CPC ... H03H 2001/0085; H03H 7/09; H03H 7/427
(Continued)

(56) References Cited

FOREIGN PATENT DOCUMENTS

JP 2001-060514 3/2001
JP 2002-237426 8/2002
(Continued)

OTHER PUBLICATIONS

International Search Report of PCT application No. PCT/JP2017/022045 dated Sep. 19, 2017.

*Primary Examiner* — Rakesh B Patel
(74) *Attorney, Agent, or Firm* — McDermott Will & Emery LLP

(57) ABSTRACT

A common mode noise filter includes a laminated body having insulator layers therein and first and second spiral conductors provided on layer planes different from each other. The first spiral conductor includes a first spiral conductor line, a first pad provided at an outer end of the first spiral conductor line, and a second pad provided at an inner end of the first spiral conductor line. The second spiral conductor includes a second spiral conductor line, a third pad provided at an outer end of the second spiral conductor line, and a fourth pad provided at an inner end of the second spiral conductor line. The first spiral conductor line faces the second spiral conductor line. Each of the second pad and the sixth pad overlaps none of the fourth pad and the eighth pad viewing from above.

12 Claims, 10 Drawing Sheets

(51) Int. Cl.
*H01F 17/04* (2006.01)
*H01F 17/00* (2006.01)
*H01F 27/29* (2006.01)
*H03H 1/00* (2006.01)

(52) U.S. Cl.
CPC ............ *H01F 27/292* (2013.01); *H03H 7/09* (2013.01); *H01F 2017/004* (2013.01); *H01F 2017/0066* (2013.01); *H01F 2017/0093* (2013.01); *H03H 2001/0035* (2013.01); *H03H 2001/0057* (2013.01); *H03H 2001/0078* (2013.01); *H03H 2001/0085* (2013.01)

(58) Field of Classification Search
USPC .................................................. 333/185, 181
See application file for complete search history.

(56) References Cited

FOREIGN PATENT DOCUMENTS

| | | |
|---|---|---|
| JP | 2013-135109 | 7/2013 |
| JP | 2015-035463 | 2/2015 |

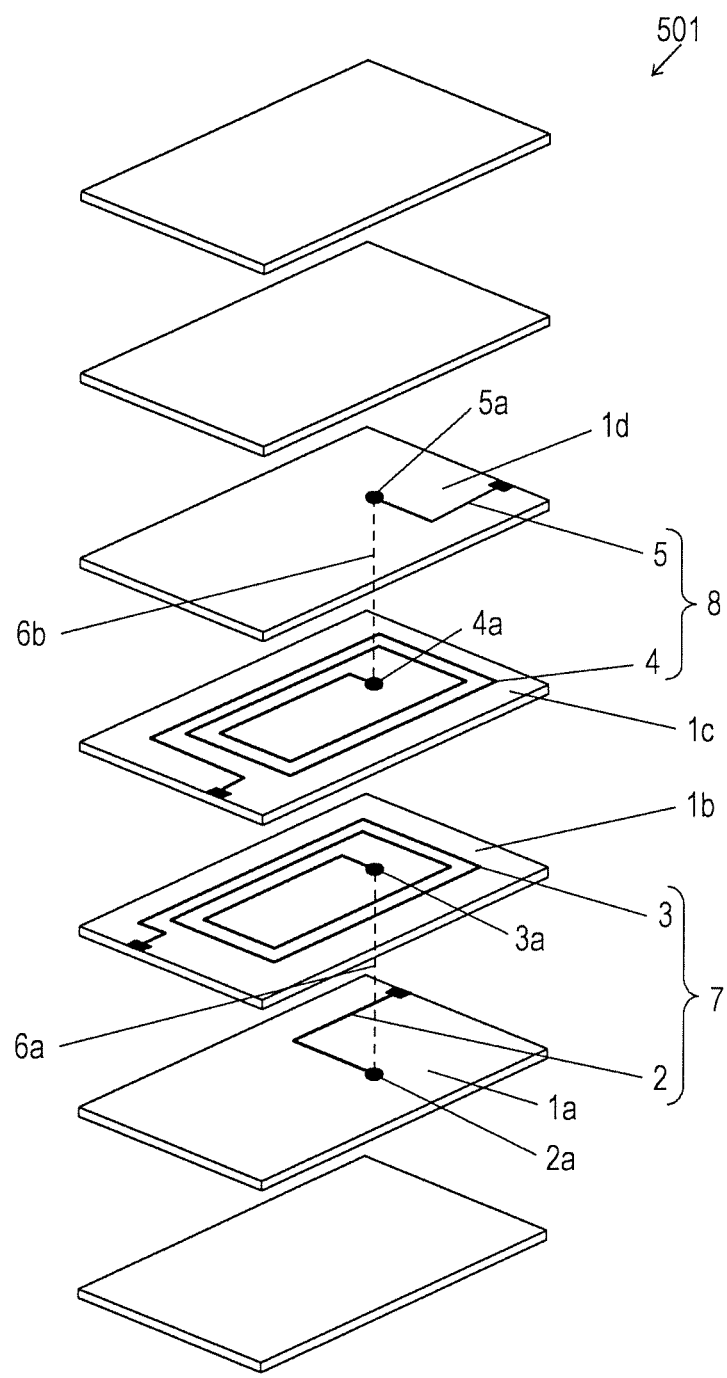
PRIOR ART FIG. 8

COMMON MODE NOISE FILTER

CROSS-REFERENCE TO RELATED APPLICATIONS

This application is a U.S. national stage application of the PCT international application No. PCT/JP2017/022045 filed on Jun. 15, 2017, which claims the benefit of foreign priority of Japanese patent application No. 2016-123190 filed on Jun. 22, 2016, the contents of all which are incorporated herein by reference.

TECHNICAL FIELD

The present disclosure relates to a common mode noise filter used for various types of electronic devices, such as a digital device, audiovisual equipment, and information communication terminal.

BACKGROUND

FIG. 8 is an exploded perspective view of conventional common mode noise filter 501. Common mode noise filter 501 includes conductors 2 to 5 on respective upper surfaces of insulating layers 1a to 1d. Coil 7 is formed by connecting pad 2a formed at one end of conductor 2 with pad 3a formed at one end of conductor 3 through via-electrode 6a. Coil 8 is formed by connecting pad 4a formed at one end of conductor 4 with pad 5a formed at one end of conductor 5 through via-electrode 6b. Conductors 3 and 4 have spiral shapes. Respective another ends of conductors 2 to 5 are connected to external electrodes.

A conventional common mode noise filter similar to common mode noise filter 501 is disclosed in, e.g. PTL 1.

CITATION LIST

Patent Literature

PTL 1 Japanese Patent Laid-Open No. 2001-60514

SUMMARY

A common mode noise filter includes a laminated body having insulator layers therein and first and second spiral conductors provided on layer planes different from each other. The first spiral conductor includes a first spiral conductor line, a first pad provided at an outer end of the first spiral conductor line, and a second pad provided at an inner end of the first spiral conductor line. The second spiral conductor includes a second spiral conductor line, a third pad provided at an outer end of the second spiral conductor line, and a fourth pad provided at an inner end of the second spiral conductor line. The first spiral conductor line faces the second spiral conductor line. Each of the second pad and the sixth pad overlaps none of the fourth pad and the eighth pad viewing from above. This common mode noise filter is usable in a high-frequency band.

BRIEF DESCRIPTION OF DRAWINGS

FIG. 8 is an exploded perspective view of a comparative example of a common mode noise filter.

DETAILED DESCRIPTION OF PREFERRED EMBODIMENT

Figure 1A:
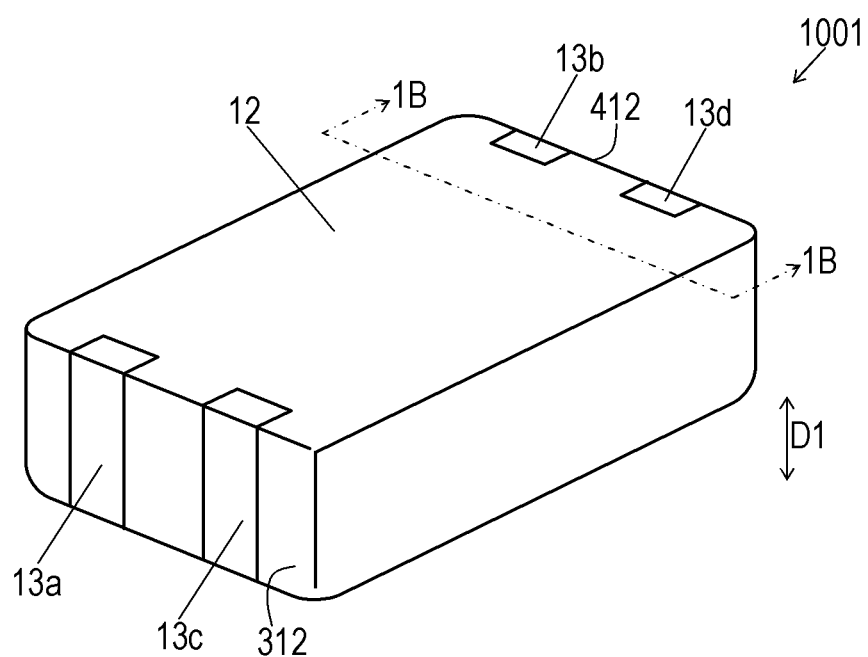
FIG. 1A is a perspective view of a common mode noise filter according to an exemplary embodiment.
Figure 1B:
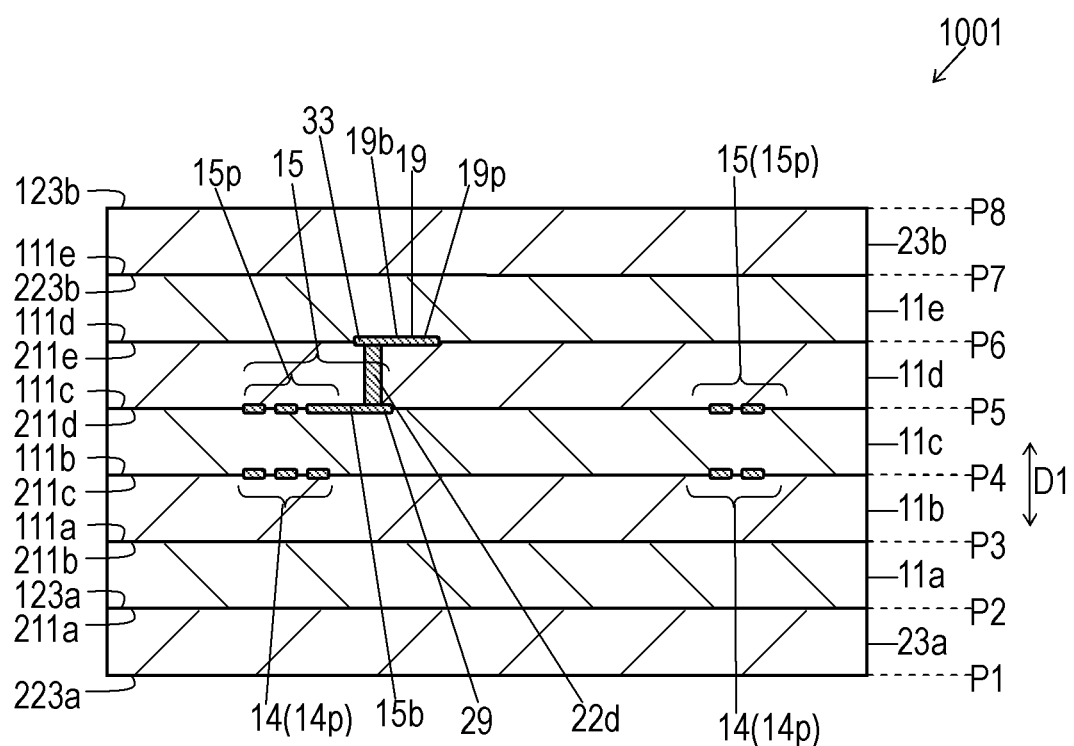
FIG. 1B is a sectional view of the common mode noise filter on line 1B-1B shown in FIG. 1A.
Figure 2:
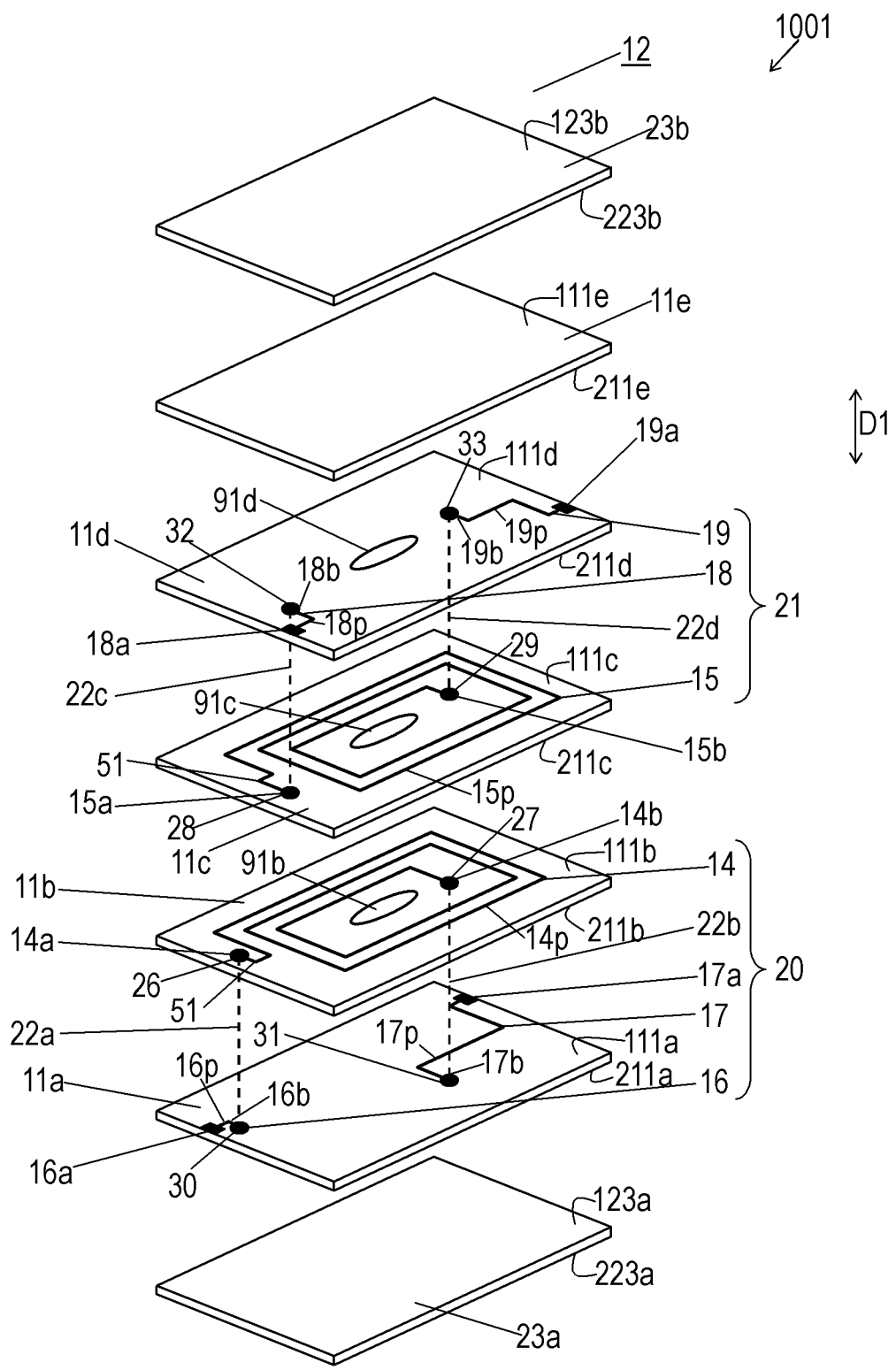
FIG. 2 is an exploded perspective view of the common mode noise filter according to the embodiment.

FIG. 1A is a perspective view of common mode noise filter 1001 according to an exemplary embodiment. FIG. 1B is a sectional view of common mode noise filter 1001 on line 1B-1B shown in FIG. 1A. FIG. 2 is an exploded perspective view of common mode noise filter 1001.

Common mode noise filter 1001 includes laminated body 12, external electrodes 13a to 13d provided outside laminated body 12, spiral conductors 14 and 15 provided inside laminated body 12, and lead conductors 16 to 19 provided inside laminated body 12. Laminated body 12 includes insulator layers 11a to 11e stacked on one another in upward and downward directions D1. Spiral conductor 14 and lead conductors 16 and 17 are connected with each other to constitute coil 20. Spiral conductor 15, and lead conductors 18 and 19 are connected with each other to constitute coil 21.

As shown in FIG. 1B, laminated body 12 includes plural insulator layers 11a to 11e, 23a, and 23b stacked in upward and downward directions D1. Insulator layer 11a is stacked on upper surface 123a of insulator layer 23a. Insulator layer 11b is stacked on upper surface 111a of insulator layer 11a. Insulator layer 11c is stacked on upper surface 111b of insulator layer 11b. Insulator layer 11d is stacked on upper surface 111c of insulator layer 11c. Insulator layer 11e is stacked on upper surface 111d of insulator layer 11d. Insulator layer 23b is stacked on upper surface 111e of insulator layer 11e. The upper surfaces and the lower surfaces of insulator layers 11a to 11e, 23a, and 23b constitute layer planes P1 to P8 separated from one another in upward and downward directions D1. Lower surface 223a of insulator layer 23a constitutes layer plane P1. Upper surface 123a of insulator layer 23a and lower surface 211a of insulator layer 11a situated on upper surface 123a of insulator layer 23a constitute layer plane P2. Upper surface 111a of insulator layer 11a and lower surface 211b of insulator layer 11b situated on upper surface 111a of insulator layer 11a constitute layer plane P3. Upper surface 111b of insulator layer 11b and lower surface 211c of insulator layer 11c situated on upper surface 111b of insulator layer 11b constitute layer plane P4. Upper surface 111c of insulator layer 11c and lower surface 211d of insulator layer 11d situated on upper surface 111c of insulator layer 11c constitute layer plane P5. Upper surface 111d of insulator layer 11d and lower surface 211e of insulator layer 11e situated on upper surface 111d of insulator layer 11d constitute layer plane P6. Upper surface 111e of insulator layer 11e and lower surface 223b of insulator layer 23b situated on upper surface 111e of insulator layer 11e constitute layer plane P7. Upper surface 123b of insulator layer 23b constitutes layer plane P8.

Spiral conductor 14 is provided inside laminated body 12 and on layer plane P4 out of plural layer planes P1 to P8. Spiral conductor 15 is provided inside laminated body 12 and on layer plane P5 out of plural layer planes P1 to P8. Lead conductor 16 is provided inside laminated body 12 and on layer plane P3 out of plural layer planes P1 to P8 different from layer plane P4. Lead conductor 17 is provided inside laminated body 12 and on layer plane P3 out of plural layer planes P1 to P8 different from layer plane P4. Lead conductor 18 is provided inside laminated body 12 and on layer plane P6 out of plural layer planes P1 to P8 different from layer plane P5. Lead conductor 19 is provided inside laminated body 12 and on layer plane P6 out of plural layer planes P1 to P8 different from layer plane P5.

Spiral conductor line 14p of spiral conductor 14 faces spiral conductor line 15p of spiral conductor 15 across one insulator layer 11c out of insulator layers 11a to 11e. External electrodes 13a to 13d are connected to ends 16a to 19a of lead conductors 16 to 19, respectively. Spiral conductors 14 and 15 are formed on insulator layers different from insulator layers having lead conductors 16 to 19 provided thereon.

Insulator layer 11a is made of magnetic material, such as Cu—Ni—Zn ferrite, or nonmagnetic material such as Cu—Zn ferrite and glass-ceramics, and has a sheet shape and insulating property.

Lead conductors 16 and 17 are formed by plating or printing a conductive material, such as silver, on upper surface 111a of insulator layer 11a. Lead conductors 16 and 17 are drawn out in different directions along upper surface 111a of insulator layer 11a. End 16a of lead conductor 16 is connected to external electrode 13a. End 17a of lead conductor 17 is connected to external electrode 13b.

Insulator layer 11b is made of nonmagnetic material, such as Cu—Zn ferrite and glass-ceramics, and has a sheet shape and insulating property. Insulator layer 11b is provided on upper surfaces of lead conductors 16 and 17. Via-electrodes 22a and 22b are provided in insulator layer 11b to pass from upper surface 111b to lower surface 211b of insulator layer 11b. Lead conductor 16 is connected to via-electrode 22a. Lead conductor 17 is connected to via-electrode 22b.

Spiral conductor 14 is formed by plating or printing a conductive material, such as silver, upper surface 111b of insulator layer 11b, and has a spiral shape. Outer end 14a of spiral conductor 14 is connected to via-electrode 22a so as to be electrically connected to lead conductor 16 through electrode 22a. Inner end 14b of spiral conductor 14, i.e., the central part of the spiral shape, is connected to via-electrode 22b so as to be electrically connected to lead conductor 17 through electrode 22b.

In this configuration, lead conductors 16 and 17 are connected to outer end 14a and inner end 14b of spiral conductor 14, respectively. Lead conductors 16 and 17 and spiral conductor 14 constitute coil 20.

Outer end 14a and inner end 14b of spiral conductor 14 are connected to external electrodes not directly from insulator layer 11b. In other words, lead conductors 16 and 17 connected to spiral conductor 14 provided formed on upper surface 111a of insulator layer 11a different from insulator layer 11b having upper surface 111b on which spiral conductor 14 is formed. Outer end 14a and inner end 14b of spiral conductor 14 are connected to external electrodes 13a and 13b through lead conductors 16 and 17, respectively.

Insulator layer 11c is made of nonmagnetic material, such as Cu—Zn ferrite and glass-ceramics, and has a sheet shape and an insulating property. Insulator layer 11c is provided on upper surface of spiral conductor 14.

Spiral conductor 15 is formed by plating or printing a conductive material, such as silver, on upper surface 111c of insulator layer 11c, and has a spiral shape. Spiral conductor 15 faces spiral conductor 14 across insulator layer 11c so as to overlap spiral conductor 14 viewing from above, and is magnetically coupled with spiral conductor 14.

Insulator layer 11d is made of nonmagnetic material, such as Cu—Zn ferrite and glass-ceramics, and has a sheet shape and an insulating property. Insulator layer 11d is provided on upper surface of spiral conductor 15. Via-electrodes 22c and 22d are provided in insulator layer 11d and pass from upper surface 111d through lower surface 211d of insulator layer 11b. Outer end 15a of spiral conductor 15 is connected to via-electrode 22c. Inner end 15b, i.e. the central part of the spiral, is connected to via-electrode 22d.

A structure of via-conductors 22a to 22d will be described below. FIG. 1B shows via-electrode 22d, an example of via-electrodes 22a to 22d. As shown in FIG. 1B, via-electrode 22d passes through at least one insulator layer 11d out of insulator layers 11a to 11e, and is connected to pads 29 and 33. Similarly, via-electrode 22a passes through at least one insulator layer 11b out of insulator layers 11a to 11e, and is connected to pads 26 and 30. Via-electrode 22b passes through at least one insulator layer 11b out of insulator layers 11a to 11e, and is connected to pads 27 and 31. Via-electrode 22c passes through at least one insulator layer 11d out of insulator layers 11a to 11e, and is connected to pads 28 and 32.

Lead conductors 18 and 19 are formed by plating or printing a conductive material, such as silver, on upper surface 111d of insulator layer 11d. Lead conductors 18 and 19 are drawn out in different directions on upper surface 111d of insulator layer 11d.

Lead conductor 18 is connected to via-electrode 22c, and is thus electrically connected to outer end 15a of spiral conductor 15 through via-electrode 22c. Lead conductor 19 is connected to via-electrode 22d, and is thus connected to inner end 15b of spiral conductor 15 through via-electrode 22d.

In this configuration, lead conductors 18 and 19 are connected to outer end 15a and inner end 15b of spiral conductor 15 through via-electrodes 22c and 22d, respectively. Lead conductors 18 and 19 and spiral conductor 15 constitute coil 21.

Outer end 15a and inner end 15b of spiral conductor 15 are connected from insulator layer 11c not directly to external electrodes. Lead conductors 18 and 19 connected to spiral conductor 15 is formed on insulator layer 11d different from insulator layer 11c having upper surface 111c having spiral conductor 15 provided thereon. Spiral conductor 15 is connected to lead conductors 18 and 19 through external electrodes 13c and 13d, respectively.

Via-electrodes 22a and 22b are formed by filling holes passing through insulator layer 11b with a conductive material, such as silver. Via-electrodes 22c and 22d are formed by filling holes passing through insulator layer 11d with a conductive material, such as silver.

Insulator layer 11e is made of magnetic material, such as Cu—Ni—Zn ferrite, or a nonmagnetic material, such as Cu—Zn ferrite and glass-ceramics, and has a sheet shape and an insulating property. Insulator layer 11e is provided on upper surfaces of lead conductors 18 and 19.

Insulator layer 23a is provided on lower surface 211a of insulator layer 11a. Insulator layer 23b is provided on upper surface 111e of insulator layer 11e. Insulator layers 23a and 23b have sheet shapes and insulating property. Insulator layers 23a and 23b may be made of either a magnetic material or a nonmagnetic material, or made of magnetic and nonmagnetic materials alternately laminated. The numbers of insulator layers 11a to 11e and insulator layers 23a and 23b are not limited to those shown in FIG. 2.

As described above, insulator layers 11a to 11e and insulator layers 23a and 23b are stacked on one another to constitute laminated body 12. External electrodes 13a and 13c are provided on end surface 312 of laminated body 12. External electrodes 13b and 13d are provided on end surface 412 of laminated body 12 opposite to end surface 312. External electrodes 13a to 13d are electrically connected to ends 16a to 19a of lead conductors 16 to 19, respectively.

Some through-holes are provided in at least one insulator layer out of insulator layers 11a to 11e which is made of nonmagnetic material. The through-holes correspond to the insides of spiral conductors 14 and 15 viewing from above. The though-holes are filled with a magnetic material to form magnetic via-parts 91b to 91d. In accordance with the embodiment, magnetic via-part 91b is provided in insulator layer 11b to pass from upper surface 111b through lower surface 211b of insulator layer 11b. Magnetic via-part 91c is provided in insulator layer 11c to pass from upper surface 111c through lower surface 211c of insulator layer 11c. Magnetic via-part 91d is provided in insulator layer 11d to pass from upper surface 111d through lower surface 211d of insulator layer 11d. Magnetic via-parts 91b to 91d increase impedance to signals in a common mode. Common mode noise filter 1001 does not necessarily include at least one of magnetic via-parts 91b to 91d.

Figure 3:
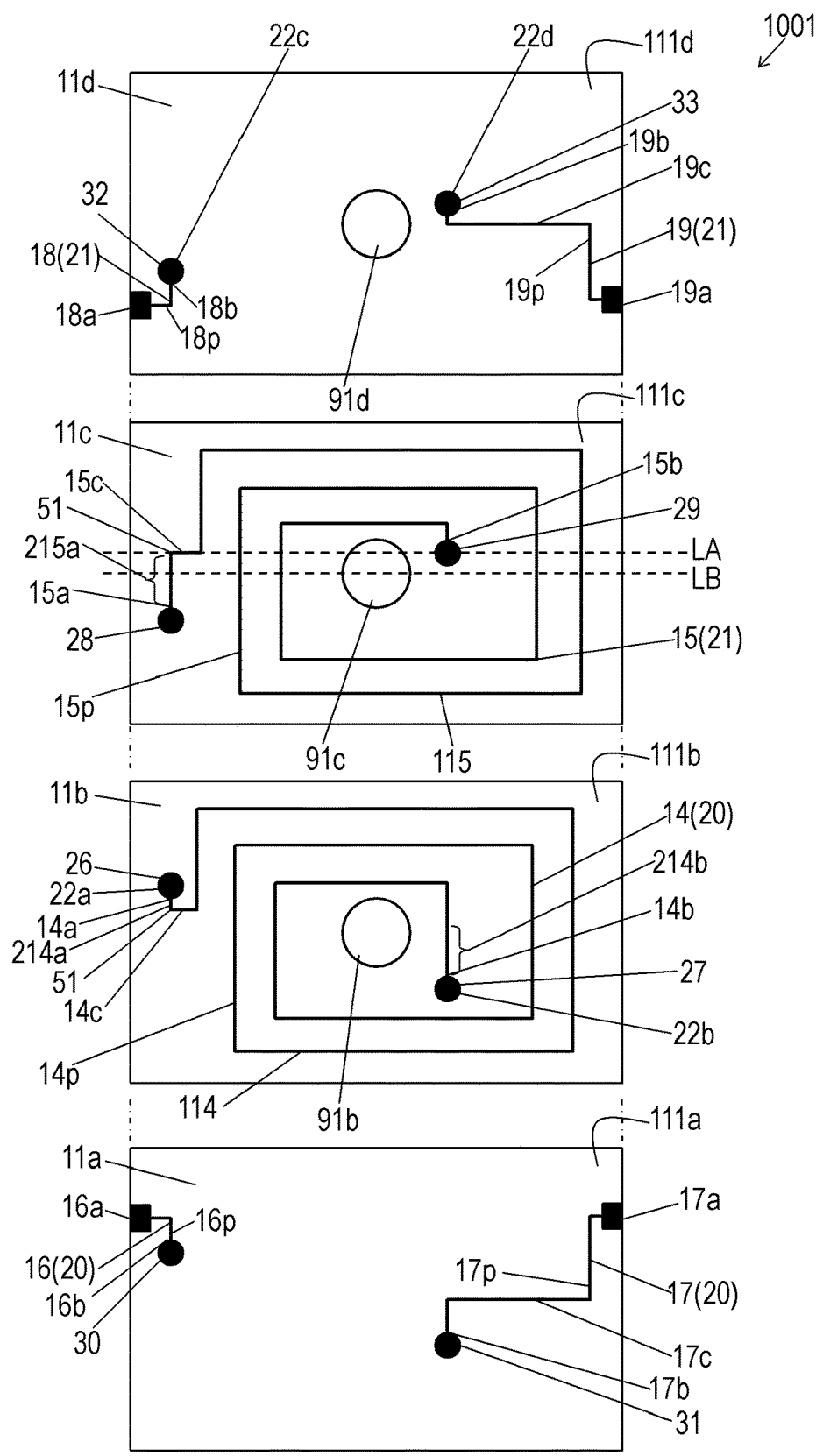
FIG. 3 is a top view of an essential part of the common mode noise filter according to the embodiment.

The arrangement of spiral conductors 14 and 15 and lead conductors 16 to 19 will be detailed below. FIG. 3 illustrates upper surface 111d of insulator layer 11d having lead conductors 18 and 19 provided thereon, upper surface 111c of insulator layer 11c having spiral conductor 15 provided thereon, upper surface 111b of insulator layer 11b having spiral conductor 14 provided thereon, and upper surface 111a of insulator layer 11a having lead conductors 16 and 17 provided thereon.

Lead conductors 18 and 19 are provided on upper surface 111d of insulator layer 11d. Lead conductor 18 includes pad 32 and lead conductor element 18p which has ends 18a and 18b. Pad 32 is provided at end 18b of lead conductor element 18p and connected to via-electrode 22c. End 18a of lead conductor element 18p is connected to external electrode 13c. Lead conductor 19 includes pad 33 and lead conductor element 19p which has ends 19a and 19b. Pad 33 is provided at end 19b of lead conductor element 19p and connected to via-electrode 22d. End 19a of lead conductor element 19p is connected to external electrode 13d. Lead conductor elements 18p and 19p extend slenderly from ends 18a and 19a to ends 18b and 19b, respectively. The diameters of pads 32 and 33 is larger than the line widths of lead conductor elements 18p and 19p perpendicular to directions in which lead conductor elements 18p and 19p slenderly extend viewing from above. Ends 18a and 19a of lead conductor elements 18p and 19p have locally large widths, and thus, are larger than the line widths of lead conductor elements 18p and 19p. In this way, ends 18a and 18b (pads 32) of lead conductor element 18p have larger line widths than the other part of lead conductor element 18p. Similarly, ends 19a and 19b (pads 33) of lead conductor element 19p has larger line widths than the other part of lead conductor element 19p.

Spiral conductor 15 is provided on upper surface 111c of insulator layer 11c. Spiral conductor 15 includes pads 28 and 29 and spiral conductor line 15p which has outer end 15a and inner end 15b. Pad 28 is provided at outer end 15a and connected to via-electrode 22c. Pad 29 is provided at inner end 15b and connected to via-electrode 22d. Spiral conductor line 15p spirally extends slenderly from outer end 15a to inner end 15b toward the center of the spiral shape. The diameters of pads 28 and 29 are larger than a line width of lead conductor 15p perpendicular to the direction in which lead conductor 15p extends slenderly viewing from above.

There is spiral conductor 14 formed on upper surface 111b of insulator layer 11b. Spiral conductor 14 includes pads 26 and 27 and spiral conductor line 14p which has outer end 14a and inner end 14b. Pad 26 is provided at outer end 14a and connected to via-electrode 22a. Pad 27 is provided at inner end 14b and connected to via-electrode 22b. Spiral conductor line 14p spirally extends slenderly from outer end 14a to inner end 14b toward the center of the spiral shape. Diameter of pads 26 and 27 are larger than a line width of lead conductor 14p perpendicular to the direction in which lead conductor 14p extends slenderly viewing from above.

Lead conductors 16 and 17 are provided on upper surface 111a of insulator layer 11a. Lead conductor 16 includes pad 30 and lead conductor element 16p which has ends 16a and 16b. Pad 30 is provided at end 16b and connected to via-electrode 22a. End 16a of lead conductor element 16p is connected to external electrode 13a. Lead conductor 17 includes pad 31 and lead conductor element 17p which has ends 17a and 17b. Pad 31 is provided at end 17b and connected to via-electrode 22b. End 17a of lead conductor element 17p is connected to external electrode 13b. Lead conductor elements 16p and 17p extend slenderly from ends 16a and 17a to ends 16b and 17b, respectively. The diameters of pads 32 and 33 is larger than the line widths of lead conductor elements 16p and 17p perpendicular to the directions in which lead conductor elements 16p and 17p slenderly extend viewing from above. Ends 16a and 17a of lead conductor elements 16p and 17p have locally large widths, and thus, are larger than the line widths of lead conductor elements 16p and 17p. Ends 16a and 17b (pad 30) of lead conductor element 16p thus has larger line widths than the other part of lead conductor element 16p. Similarly, end 17a and end 17b (pad 31) of lead conductor element 17p have larger line widths than the other part of lead conductor element 17p.

Pads 26, 27, 30, and 31 constitute parts of coil 20. Pads 28, 29, 32, and 33 constitute parts of coil 21.

Pads 26 and 30 and via-electrode 22a overlap one another viewing from above, and are connected with one another. Pads 27 and 31 and via-electrode 22b overlap one another viewing from above, and are connected with one another. Pads 28 and 32 and via-electrode 22c overlap one another viewing from above, and are connected with one another. Pads 29 and 33 and via-electrode 22d overlap one another viewing from above, and are connected with one another.

Via-electrode 22a has a smaller area than pads 26 and 30 view from above, and is not exposed from pad 26 or 30 viewing from above. Via-electrode 22b has a smaller area than pads 27 and 31 viewing from above, and is not exposed from pads 27 and 31 viewing from above. Via-electrode 22c has a smaller area than pads 28 and 32 viewing from above, and is not exposed from pad 28 or 32 viewing from above. Via-electrode 22d has a smaller size than pads 29 and 33 viewing from above, and is not exposed from pad 29 or 33 viewing from above.

Each of pads 27 and 31 of coil 20 at inner end 14b of spiral conductor 14 overlaps none of pads 29 and 33 of coil 21 at inner end 15b of spiral conductor 15 viewing from above. Similarly, each of pads 26 and 30 of coil 20 at outer end 14a of spiral conductor 14 overlaps none of pads 28 and 32 of coil 21 at outer end 15a of spiral conductor 15 viewing from above.

Thicknesses of lead conductor elements 16p to 19p of lead conductors 16 to 19 in upward and downward directions D1 is larger than those of spiral conductor lines 14p and 15p of spiral conductors 14 and 15 in upward and downward directions D1. Alternatively, the line widths of lead conductor elements 16p to 19p of lead conductors 16 to 19 are larger than the line widths of spiral conductor lines 14p and 15p of spiral conductors 14 and 15. This configuration allows lead conductors 16 to 19 to be connected to external electrodes 13a to 13d reliably. Lead conductors 16 to 19 hardly influence common mode noise, and reduce fluctuations of the DC resistance and the characteristic impedance.

Figure 4:
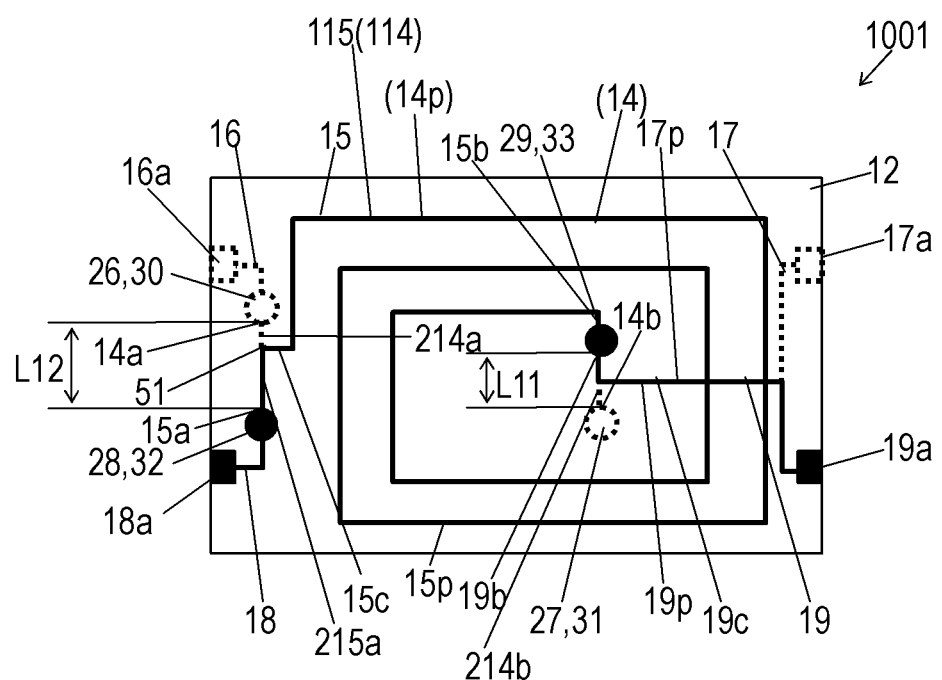
FIG. 4 is a top view of an essential part of the common mode noise filter according to the embodiment.

FIG. 4 illustrates spiral conductors 14 and 15 and lead conductors 16 to 19 while insulator layers 11a to 11e are stacked on one another.

As shown in FIGS. 3 and 4, each of pads 26 and 30 provided at outer end 14a of spiral conductor 14 overlaps none of pads 28 and 32 provided at outer end 15a of spiral conductor 15 viewing from above. Each of pads 27 and 31 provided at inner end 14b of spiral conductor 14 overlaps none of pads 29 and 33 provided at inner end 15b of spiral conductor 15 viewing from above. In other words, pads 26 and 30. i.e., parts of coil 20, do not overlap pads 28 and 32. i.e., parts of coil 21, viewing from above. Pads 27 and 31, i.e., parts of coil 20, overlap none of pads 29 and 33, i.e., parts of coil 21, viewing from above.

Part 17c of lead conductor element 17p of lead conductor 17 overlaps part 19c of lead conductor element 19p of lead conductor 19 viewing from above. Parts of close parts 14c and 15c of outer ends 14a and 15a of spiral conductors 14 and 15 overlap one another viewing from above.

As described above, coils 20 and 21, as well as spiral conductors 14 and 15 (spiral conductor lines 14p and 15p) and lead conductors 16 to 19 (lead conductor elements 16p to 19p) constituting coils 20 and 21, are linear conductors extending slenderly. A linear conductor has a line length that is a length along the direction the conductor extending slenderly. The line lengths of coils 20 and 21, spiral conductors 14 and 15 (spiral conductor lines 14p and 15p), and lead conductors 16 to 19 (lead conductor elements 16p to 19p) will be described below.

In order for each of pads 27 and 31 to overlap none of pads 29 and 33 viewing from above, inner end 14b of spiral conductor 14 is formed at a position spirally advancing from inner end 15b of spiral conductor 15. As a result, inner end 15b of spiral conductor 15 overlaps spiral conductor line 14p of spiral conductor 14 viewing from above. Hence, the line length of spiral conductor 14 (spiral conductor line 14p) along spiral conductor 14 (spiral conductor line 14p) is larger than the line length of spiral conductor 15 (spiral conductor line 15p) along spiral conductor 15 (spiral conductor line 15p).

As shown in FIGS. 3 and 4, line LA is defined. Line LA extends in the direction from external electrodes 13a and 13c toward external electrodes 13b and 13d opposite to external electrodes 13a and 13c, respectively, and passes through close parts 14c and 15c close to outer ends 14a and 15a overlapping each other viewing from above. Center line LB extending in the above direction is defined. Central line LB passes through the central part of laminated body 12 viewing from above. Line LA is positioned at a side to outer end 14a of spiral conductor 14 with respect to center line LB. In this structure, the line length of spiral conductor 14 between close part 14c and outer end 14a can be shorter than the line length of spiral conductor 15 between close part 15c and outer end 15a. Resultingly, the line length of spiral conductor 14 (coil 20) can be substantially equal to the line length of spiral conductor 15 (coil 21).

The distance between inner end 14b of spiral conductor 14 and inner end 15b of spiral conductor 15 is preferably twice the distance between line LA and center line LB viewing from above.

The structure that the line length of spiral conductor 14 is substantially equal to that of spiral conductor 15 prevents phase shift in timing of signals passing through coils 20 and 21 even for high frequencies of the signals, thereby effectively reducing common mode noise in these signals.

Part 17c of lead conductor element 17p of lead conductor 17 overlaps part 19c of lead conductor element 19p of lead conductor 19 viewing from above. Parts of close parts 14c and 15c close to outer ends 14a and 15a of spiral conductors 14 and 15 overlap each other viewing from above. Hence, the line length of lead conductor 16 is substantially equal to that of lead conductor 18. The line length of lead conductor 17 is substantially equal to that of lead conductor 19. With this structure, the line lengths of spiral conductors 14 and 15 substantially equal to each other allow the line lengths of coils 20 and 21 to be substantially equal to each other. If the line length of lead conductor 16 is not equal to that of lead conductor 18, or if the line length of lead conductor 17 is not equal to that of lead conductor 19, the distance between line LA and center line LB is preferably adjusted to allow the line lengths of coils 20 and 21 to be substantially equal to each other.

The line length of each conductor element will be detailed with referring to FIGS. 3 and 4. Spiral conductor line 14p includes outer non-overlapping part 214a extending from outer end 14a, overlapping part 114 connected to outer non-overlapping part 214a, and inner non-overlapping part 214b extending from inner end 14b and connected to overlapping part 114. Outer non-overlapping part 214a and inner non-overlapping part 214b do not overlap spiral conductor line 15p viewing from above. Overlapping part 114 overlaps spiral conductor line 15p viewing from above. Spiral conductor line 15p includes outer non-overlapping part 215a extending from outer end 15a, and overlapping part 115 connected to outer non-overlapping part 215a. Outer non-overlapping part 215a does not overlap spiral conductor line 14p viewing from above. Overlapping part 114 is connected to outer non-overlapping part 214a at connecting position 51 viewing from above. Overlapping part 115 is connected to outer non-overlapping part 215a at connecting position 51 viewing from above. Outer end 14a is closer to connecting position 51 than outer end 15a. The line length of outer non-overlapping part 215a is longer than that of outer non-overlapping part 214a. Overlapping parts 114 and 115 include close parts 14c and 15c, and partly overlap line La.

If the line lengths of lead conductor elements 17p and 19p are equal to each other and at the same time the line lengths of lead conductor elements 16p and 18p are equal to each other, the line lengths of outer non-overlapping parts 214a and 215a and the line length of inner non-overlapping part 214b can be determined such that the line length of coil 20 is substantially equal to that of coil 21.

In that case that the line lengths of lead conductor elements 17p and 19p are not equal to each other, or that the line lengths of lead conductor elements 16p and 18p are not equal to each other, the line lengths of outer non-overlapping parts 214a and 215a, the line length of inner non-overlapping part 214b, and the line lengths of lead conductor elements 16p to 19p can be determined such that the line length of coil 20 is substantially equal to that of coil 21.

The configuration in which the line lengths of coils 20 and 21 is substantially equal to each other prevents phase shift in timing of signals passing through coils 20 and 21 even for high frequencies of the signals, thereby effectively reducing common mode noise of these signals.

Figure 5A:
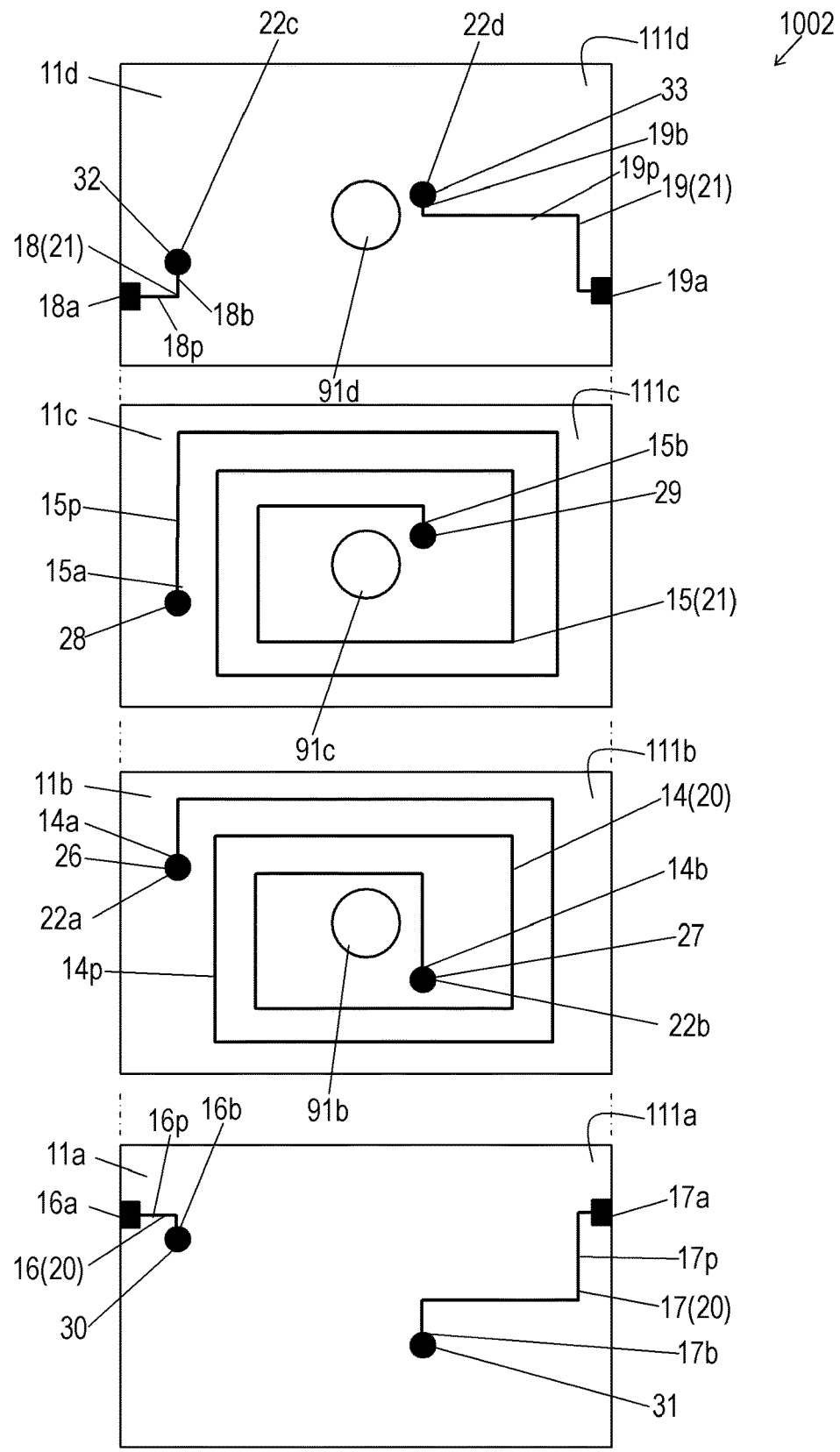
FIG. 5A is a top view of an essential part of another common mode noise filter according to the embodiment.
Figure 5B:
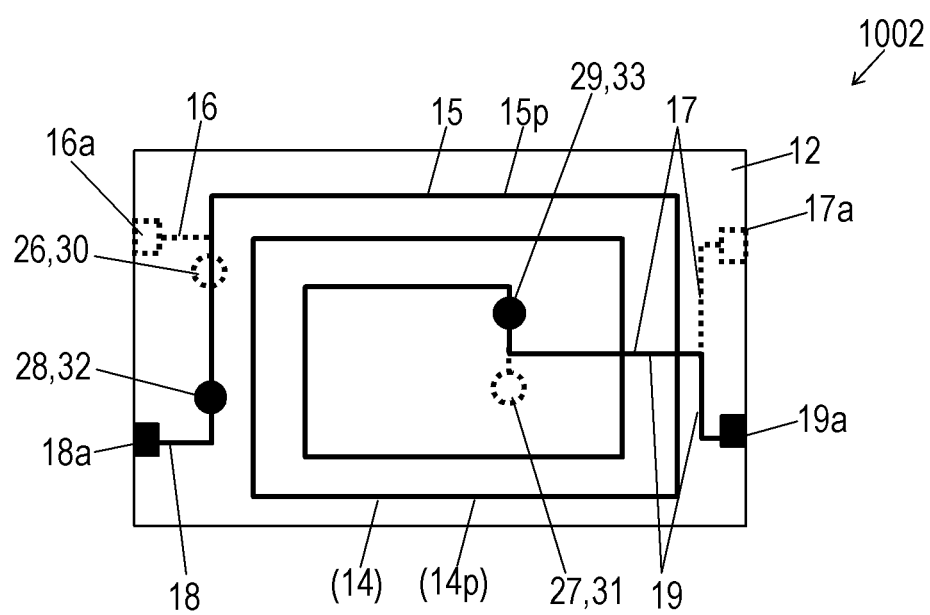
FIG. 5B is a top view of an essential part of the common mode noise filter shown in FIG. 5A.

FIGS. 5A and 5B are top views of essential parts of another common mode noise filter 1002 according to the embodiment. In FIGS. 5A and 5B, components identical to those of common mode noise filter 1001 shown in FIG. 1A to 4 are denoted by the same reference numerals. In common mode noise filter 1002 shown in FIGS. 5A and 5B, outer end 14a of spiral conductor 14 overlaps spiral conductor line 15p of spiral conductor 15 viewing from above. This structure allows the line length of spiral conductor 14 to be substantially equal to that of spiral conductor 15. In common mode noise filter 1002, lead conductor 16 does not overlap lead conductor 18 viewing from above. In common mode noise filter 1002, similarly to common mode noise filter 1001, outer end 14a of spiral conductor 14 overlaps spiral conductor line 15p of spiral conductor 15 viewing from above.

As shown in FIGS. 3 to 5B, in common mode noise filters 1001 and 1002, part 17c of lead conductor element 17p overlaps part 19c of lead conductor element 19p viewing from above, and a part of close part 14c close to outer end 14a of spiral conductor line 14p overlaps a part of close part 15c of outer end 15a of spiral conductor line 15p viewing from above. This structure allows the characteristics impedance of common mode noise filters 1001 and 1002 to be optimized.

Figure 6:
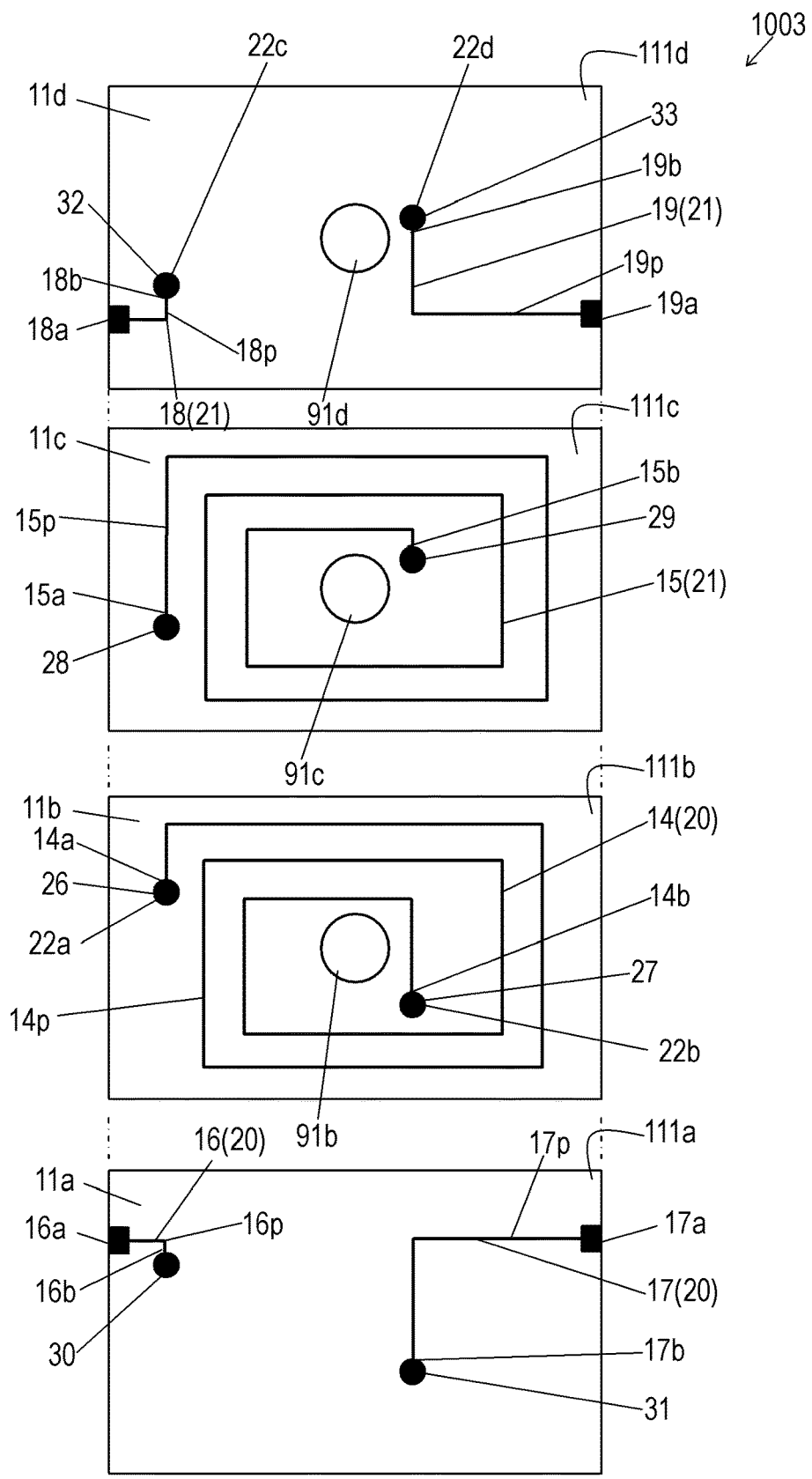
FIG. 6 is a top view of an essential part of still another common mode noise filter according to the embodiment.
Figure 7:
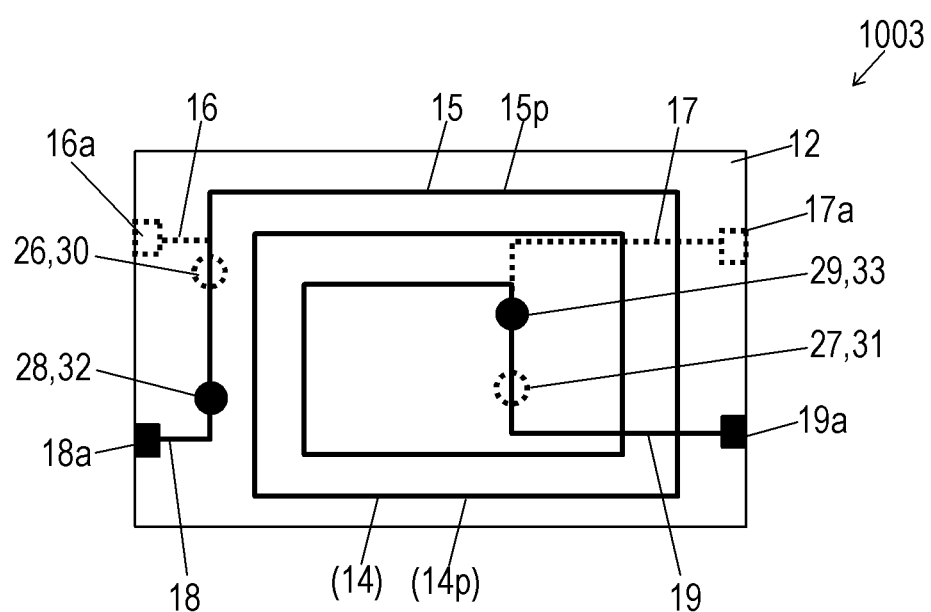
FIG. 7 is a top view of an essential part of the common mode noise filter shown in FIG. 6.

FIGS. 6 and 7 are top views of essential parts of still another common mode noise filter 1003 according to the embodiment. In FIGS. 6 and 7, components identical to those of common mode noise filter 1002 shown in FIGS. 5A and 5B are denoted by the same reference numerals. In common mode noise filter 1003 shown in FIGS. 6 and 7, similarly to common mode noise filter 1002 shown in FIGS. 5A and 5B, lead conductor 16 does not overlap lead conductor 18 viewing from above. As shown in FIGS. 6 and 7, in common mode noise filter 1003, lead conductor element 17p of lead conductor 17 excluding close parts of pads 30 to 33 does not overlap lead conductor element 19p of lead conductor 19 viewing from above.

As described above, as a result that the thicknesses of lead conductors 16 to 19 are larger than those of spiral conductors 14 and 15, or the line widths of lead conductors 16 to 19 are larger than those of spiral conductors 14 and 15, lead conductors 16 to 19 can be connected to external electrodes 13a to 13d reliably, respectively. In common mode noise filter 1003 shown in FIGS. 6 and 7, a stray capacitance produced between lead conductors 16 and 18, and a stray capacitance produced between lead conductors 17 and 19 can be reduced, allowing the filter to be used more reliably in a high-frequency band.

In common mode noise filters 1001 to 1003 shown in FIGS. 1A to 7, distance L11 between pad 27 (31) and pad 29 (33) at inner ends 14b and 15b viewing from above is larger than the diameters of pads 26 to 33. When laminated body 12 is produced by stacking insulator layers 11a to 11e, lamination deviation may occur. The lamination deviation is a phenomenon in which the position of the center of via-electrode 22d may deviate from the centers of pads 27 and 31 in a direction parallel with layer planes P5 and P6 due to variations of accuracy in the positions of insulator layers 11a to 11e during the stacking process. Even if via-electrode 22d reaches a part near pads 27 and 31 due to the lamination deviation and via-electrode 22d is connected near the outer peripheries of pads 27 and 31, each of pads 27 and 31 of common mode noise filters 1001 to 1003 overlap none of pads 29 and 33 viewing from above, and does not face the other across the insulator layer. This structure reliably reduces the stray capacitance between pads 27 and 29.

Distance L12 between pad 26 (30) and pad 28 (32) at outer ends 14a and 15a viewing from above is larger than distance L11 between pad 27 (31) and pad 29 (33) viewing from above. This configuration reduces the stray capacitance between coils 20 and 21 at pads 26, 28, 30, and 32 reliably.

The usage in ultrahigh-speed (as high as 10 Gbps) transmission as represented by USB 3.1 is required, and thus common mode noise filters are demanded to be used in such a high-frequency band.

In common mode noise filter 501 shown in FIG. 8, pads 2a to 5a overlap one another, and additionally, are connected to via-electrodes 6a and 6b. Thus, the widths or diameters of pads 3a and 4a are larger than the line widths of coils 7 and 8 that are transmitting differential signals and are magnetically coupled. Accordingly, a large stray capacitance occurs between pads 2a to 5a, causing mismatch between differential signals to increase insertion loss in a high-frequency band, which may cause troubles in using the filter in a high-frequency band.

This common mode noise filter is usable in a high-frequency band.

In common mode noise filters 1001 to 1003 according to the embodiment, each of pads 26 and 30 overlaps none of pads 28 and 32 at outer ends 14a and 15a of spiral conductors 14 and 15 viewing from above. Furthermore, each of pads 27 and 31 overlaps none of pads 29 and 33 at inner ends 14b and 15b of spiral conductors 14 and 15 viewing from above. This structure reduces the stray capacitance between pad 26 (30) and pad 27 (31), and the stray capacitance between pad 18 (32) and pad 29 (33), which prevents an increase of insertion loss due to mismatch between differential signals in a high-frequency band. Hence, common mode noise filters 1001 to 1003 are preferably usable in a high-frequency band.

In common mode noise filters 1001 to 1003, pads 27, 29, 31, and 33 at inner ends 14b and 15b of spiral conductors 14 and 15 do not overlap one another viewing from above, and besides, pads 26, 28, 30, and 32 at outer ends 14a and 15a do not overlap one another viewing from above.

In common mode noise filters 1001 to 1003 according to the embodiment, spiral conductors 14 and 15 are positioned between lead conductors 16 and 17, and between lead conductors 18 and 19 in upward and downward directions D1. In other words, layer planes P4 and P5 on which spiral conductors 14 and 15 are positioned are located between layer plane P3 on which lead conductors 16 and 17 are positioned and layer plane P6 on which lead conductors 18 and 19 are positioned. Besides this arrangement, lead conductors 16 to 19 may be positioned between spiral conductors 14 and 15. In other words, the layer planes on which lead conductors 16 to 19 are positioned may be located between the layer plane on which spiral conductor 14 is positioned and the layer plane on which spiral conductor 15 is positioned.

In common mode noise filters 1001 to 1003 according to the embodiment, lead conductors 16 and 17 are positioned on layer plane P3, and lead conductors 18 and 19 are positioned on layer plane P6. Besides this arrangement, the layer plane on which lead conductor 16 is positioned may be different from the layer plane on which lead conductor 17 is positioned. Furthermore, the layer plane on which lead conductor 18 is positioned may be different from the layer plane on which lead conductor 19 is positioned.

In accordance with the embodiment, terms, such as "upper surface," "lower surface," "upward and downward," and "viewing from above", indicating directions indicates relative directions determined only by a positional relationship between components, such as insulator layers and spiral conductors, and lead conductors, of a common mode noise filter, and do not indicate absolute directions such as a vertical direction.

A common mode noise filter according to the present disclosure is preferably usable in a high-frequency band and is useful especially for a high-frequency device, such as a digital device, audiovisual equipment, and information communication terminal.

REFERENCE MARKS IN THE DRAWINGS 11a-11e insulator layer
12 laminated body
13a external electrode (first external electrode)
13b external electrode (second external electrode)
13c external electrode (third external electrode)
13d external electrode (fourth external electrode)
14 spiral conductor (first spiral conductor)
14p spiral conductor line (first spiral conductor line)
15 spiral conductor (second spiral conductor)
15p spiral conductor line (second spiral conductor line)
16 lead conductor (first lead conductor)
16p lead conductor element (first lead conductor element)
17 lead conductor (second lead conductor)
17p lead conductor element (second lead conductor element)
18 lead conductor (third lead conductor)
18p lead conductor element (third lead conductor element)
19 lead conductor (fourth lead conductor)
19p lead conductor element (fourth lead conductor element)
20 coil (first coil)
21 coil (second coil)
22a via-electrode (first via-electrode)
22b via-electrode (second via-electrode)
22c via-electrode (third via-electrode)
22d via-electrode (fourth via-electrode)
26 pad (first pad)
27 pad (second pad)
28 pad (third pad)
29 pad (fourth pad)
30 pad (fifth pad)
31 pad (sixth pad)
32 pad (seventh pad)
33 pad (eighth pad)
51 connecting position
P1-P3, P6-P8 layer plane
P4 layer plane (first layer plane)
P5 layer plane (second layer plane)

The invention claimed is:

1. A common mode noise filter comprising:
a laminated body including a plurality of insulator layers stacked in upward and downward directions, upper surfaces and lower surfaces of the plurality of insulator layers constituting a plurality of layer planes separated from one another in the upward and downward directions;
a first spiral conductor provided inside the laminated body and on a first layer plane out of the plurality of layer planes, the first spiral conductor including:
a first spiral conductor line having a first inner end and a first outer end,
a first pad provided at the first outer end of the first spiral conductor line, and
a second pad provided at the first inner end of the first spiral conductor line;
a second spiral conductor provided inside the laminated body and on a second layer plane out of the plurality of layer planes, the second spiral conductor including:
a second spiral conductor line having a second inner end and a second outer end,
a third pad provided at the second outer end of the second spiral conductor line, and
a fourth pad provided at the second inner end of the second spiral conductor line;
a first lead conductor provided inside the laminated body and on a layer plane out of the plurality of layer planes different from the first layer plane, the first lead conductor having a first lead conductor element and a fifth pad provided at a first end of the first lead conductor element;
a second lead conductor provided inside the laminated body and on a layer plane out of the plurality of layer planes different from the first layer plane, the second lead conductor having a second lead conductor element and a sixth pad provided at a first end of the second lead conductor element;
a third lead conductor provided inside the laminated body and on a layer plane out of the plurality of layer planes different from the second layer plane, the third lead conductor having a third lead conductor element and a seventh pad provided at a first end of the third lead conductor element;
a fourth lead conductor provided inside the laminated body and on a layer plane out of the plurality of layer planes different from the second layer plane, the fourth lead conductor having a fourth lead conductor element and an eighth pad provided at a first end of the fourth lead conductor element;
a first via-electrode passing through at least one of the plurality of insulator layers, the first via-electrode being connected to the first pad and the fifth pad;
a second via-electrode passing through at least one of the plurality of insulator layers, the second via-electrode being connected to the second pad and the sixth pad;
a third via-electrode passing through at least one of the plurality of insulator layers, the third via-electrode being connected to the third pad and the seventh pad; and
a fourth via-electrode passing through at least one of the plurality of insulator layers, the fourth via-electrode being connected to the fourth pad and the eighth pad,
wherein the first spiral conductor line faces the second spiral conductor line across one of the plurality of insulator layers,
wherein each of the second pad and the sixth pad overlaps none of the fourth pad and the eighth pad when viewing the filter from above,
wherein each of the first pad and the fifth pad overlaps none of the third pad and the seventh pad when viewing the filter from above,
wherein the first spiral conductor line includes:
a first outer non-overlapping part extending from the first outer end, the first outer non-overlapping part not overlapping the second spiral conductor line when viewing the filter from above; and a first overlapping part connected to the first outer non-overlapping part, the first overlapping part overlapping the second spiral conductor line when viewing the filter from above, wherein the second spiral conductor line includes:
a second outer non-overlapping part extending from the second outer end, the second outer non-overlapping not overlapping the first spiral conductor line when viewing the filter from above, and
a second overlapping part connected to the second outer non-overlapping part, the second overlapping part overlapping the first spiral conductor line when viewing the filter from above, wherein the first overlapping part is connected to the first outer non-overlapping part at a connecting position when viewing the filter from above, wherein the second overlapping part is connected to the second outer non-overlapping part at the connecting position when viewing the filter from above, and wherein the first outer end is closer to the connecting position than the second outer end.

2. The common mode noise filter of claim 1, further comprising:
a first external electrode provided outside the laminated body and connected to a second end of the first lead conductor element;
a second external electrode provided outside the laminated body and connected to a second end of the second lead conductor element;
a third external electrode provided outside the laminated body and connected to a second end of the third lead conductor element; and
a fourth external electrode provided outside the laminated body and connected to a second end of the fourth lead conductor element.

3. The common mode noise filter of claim 1, wherein, when viewing the filter from above, a distance from each of the second pad and the sixth pad to each of the fourth pad and the eighth pad is larger than diameters of the first to eighth pads.

4. The common mode noise filter of claim 1,
wherein the first lead conductor does not overlap the third lead conductor when viewing the filter from above, and
wherein the second lead conductor does not overlap the fourth lead conductor when viewing the filter from above.

5. The common mode noise filter of claim 1, wherein a line length of the second outer non-overlapping part is larger than a line length of the first outer non-overlapping part.

6. The common mode noise filter of claim 1, wherein the first spiral conductor line further includes an inner non-overlapping part extending from the first inner end and connected to the first overlapping part, the inner non-overlapping part being not overlapping the second spiral conductor line when viewing the filter from above.

7. The common mode noise filter of claim 6,
wherein the first lead conductor, the second lead conductor, and the first spiral conductor constitute a first coil,
wherein the third lead conductor, the fourth lead conductor, and the third spiral conductor constitute a second coil, and
wherein a line length of the first outer non-overlapping part and a line length of the second outer non-overlapping part are determined such that a line length of the first coil is substantially equal to a line length of the second coil.

8. The common mode noise filter of claim 1,
wherein the first lead conductor, the second lead conductor, and the first spiral conductor constitute a first coil,
wherein the third lead conductor, the fourth lead conductor, and the third spiral conductor constitute a second coil, and
wherein a line length of the first outer non-overlapping part and a line length of the second outer non-overlapping part are determined such that a line length of the first coil is substantially equal to a line length of the second coil.

9. A common mode noise filter comprising:
a laminated body including a plurality of insulator layers stacked in upward and downward directions, upper surfaces and lower surfaces of the plurality of insulator layers constituting a plurality of layer planes separated from one another in the upward and downward directions;
a first spiral conductor provided inside the laminated body and on a first layer plane out of the plurality of layer planes, the first spiral conductor including:
a first spiral conductor line having a first inner end and a first outer end,
a first pad provided at the first outer end of the first spiral conductor line, and
a second pad provided at the first inner end of the first spiral conductor line;
a second spiral conductor provided inside the laminated body and on a second layer plane out of the plurality of layer planes, the second spiral conductor including:
a second spiral conductor line having a second inner end and a second outer end,
a third pad provided at the second outer end of the second spiral conductor line, and
a fourth pad provided at the second inner end of the second spiral conductor line;
a first lead conductor provided inside the laminated body and on a layer plane out of the plurality of layer planes different from the first layer plane, the first lead conductor having a first lead conductor element and a fifth pad provided at a first end of the first lead conductor element;
a second lead conductor provided inside the laminated body and on a layer plane out of the plurality of layer planes different from the first layer plane, the second lead conductor having a second lead conductor element and a sixth pad provided at a first end of the second lead conductor element;
a third lead conductor provided inside the laminated body and on a layer plane out of the plurality of layer planes different from the second layer plane, the third lead conductor having a third lead conductor element and a seventh pad provided at a first end of the third lead conductor element;
a fourth lead conductor provided inside the laminated body and on a layer plane out of the plurality of layer planes different from the second layer plane, the fourth lead conductor having a fourth lead conductor element and an eighth pad provided at a first end of the fourth lead conductor element;
a first via-electrode passing through at least one of the plurality of insulator layers, the first via-electrode being connected to the first pad and the fifth pad;
a second via-electrode passing through at least one of the plurality of insulator layers, the second via-electrode being connected to the second pad and the sixth pad;

a third via-electrode passing through at least one of the plurality of insulator layers, the third via-electrode being connected to the third pad and the seventh pad; and a fourth via-electrode passing through at least one of the plurality of insulator layers, the fourth via-electrode being connected to the fourth pad and the eighth pad, wherein the first spiral conductor line faces the second spiral conductor line across one of the plurality of insulator layers, wherein each of the second pad and the sixth pad overlaps none of the fourth pad and the eighth pad when viewing the filter from above, wherein each of the first pad and the fifth pad overlaps none of the third pad and the seventh pad when viewing the filter from above, and wherein the second spiral conductor line overlaps the first outer end of the first spiral conductor line when viewing the filter from above.

10. The common mode noise filter of claim 9, further comprising:

a first external electrode provided outside the laminated body and connected to a second end of the first lead conductor element;

a second external electrode provided outside the laminated body and connected to a second end of the second lead conductor element;

a third external electrode provided outside the laminated body and connected to a second end of the third lead conductor element; and a fourth external electrode provided outside the laminated body and connected to a second end of the fourth lead conductor element.

11. The common mode noise filter of claim 9, wherein the first lead conductor does not overlap the third lead conductor when viewing the filter from above, and wherein the second lead conductor does not overlap the fourth lead conductor when viewing the filter from above.

12. The common mode noise filter of claim 9, wherein, when viewing the filter from above, a distance from each of the second pad and the sixth pad to each of the fourth pad and the eighth pad is larger than diameters of the first to eighth pads.

\* \* \* \* \*